(12) United States Patent
Naderyan et al.

(10) Patent No.: US 11,197,088 B2
(45) Date of Patent: Dec. 7, 2021

(54) MEMS MICROPHONE WITH ACOUSTIC RELIEF CHANNELS

(71) Applicant: Knowles Electronics, LLC, Itasca, IL (US)

(72) Inventors: Vahid Naderyan, Itasca, IL (US); Mohammad Mohammadi, Arlington Heights, IL (US); Evan Llamas-Young, Morgan Hill, CA (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 16/871,027

(22) Filed: May 10, 2020

(65) Prior Publication Data

US 2020/0389721 A1 Dec. 10, 2020

Related U.S. Application Data

(60) Provisional application No. 62/846,173, filed on May 10, 2019.

(51) Int. Cl.
| | |
|---|---|
| *H04R 19/00* | (2006.01) |
| *H04R 1/28* | (2006.01) |
| *H04R 19/04* | (2006.01) |
| *H04R 7/04* | (2006.01) |
| *H04R 7/18* | (2006.01) |

(Continued)

(52) U.S. Cl.
CPC ......... *H04R 1/2807* (2013.01); *B81B 3/0021* (2013.01); *B81C 1/00158* (2013.01); *H04R 1/04* (2013.01); *H04R 7/04* (2013.01); *H04R 7/18* (2013.01); *H04R 19/04* (2013.01); *H04R 31/003* (2013.01); *B81B 2201/0257* (2013.01); *B81B 2203/0127* (2013.01); *B81B 2203/0338* (2013.01); *B81C 2201/013* (2013.01); *B81C 2201/0109* (2013.01); *B81C 2201/0143* (2013.01); *H04R 2201/003* (2013.01)

(58) Field of Classification Search
CPC ........ H04R 1/2807; H04R 19/04; H04R 7/04; H04R 7/18; H04R 31/003; H04R 1/04; H04R 2201/003; B81B 3/0021; B81B 2201/0257; B81B 2203/0338; B81B 2203/0127; B81C 1/00158; B81C 2201/0109; B81C 2201/013; B81C 2201/0143

See application file for complete search history.

(56) References Cited

U.S. PATENT DOCUMENTS

| | | | |
|---|---|---|---|
| 2016/0167946 A1* | 6/2016 | Jenkins | H04R 19/04 257/416 |
| 2018/0002167 A1* | 1/2018 | Frischmuth | G01Q 60/24 |

FOREIGN PATENT DOCUMENTS

| | | | | |
|---|---|---|---|---|
| CN | 206212271 U | * | 11/2016 | H04R 19/04 |

* cited by examiner

*Primary Examiner* — Matthew A Eason
(74) *Attorney, Agent, or Firm* — Loppnow & Chapa; Matthew C. Loppnow (57) ABSTRACT

A MEMS transducer includes a transducer substrate, a back plate, a diaphragm, and an intermediate layer. The transducer substrate includes an aperture. The back plate is coupled to a first surface of the transducer substrate and covers the aperture. The diaphragm is oriented substantially parallel to the back plate and is spaced apart from the back plate to form a gap. The intermediate layer is coupled to the diaphragm and the back plate and includes an acoustic relief channel, which fluidly couples the gap to an environment surrounding the MEMS transducer.

21 Claims, 8 Drawing Sheets

(51) Int. Cl.
*H04R 31/00* (2006.01)
*B81B 3/00* (2006.01)
*B81C 1/00* (2006.01)
*H04R 1/04* (2006.01)

MEMS MICROPHONE WITH ACOUSTIC RELIEF CHANNELS

FIELD OF THE DISCLOSURE

The present disclosure relates to microphone assemblies that include microelectromechanical systems, and more particularly to acoustic relief in such microphone assemblies, such as for high sound pressure level applications.

BACKGROUND

Microphone assemblies that include microelectromechanical systems (MEMS) acoustic transducers convert acoustic energy into an electrical signal. The microphone assemblies may be employed in mobile communication devices, laptop computers, and appliances, among other devices and machinery. Microphone assemblies that include MEMS acoustic transducers often have poor characteristics for high sound pressure level (SPL) acoustic activity.

SUMMARY

A first aspect of the present disclosure relates to a MEMS transducer. The MEMS transducer includes a transducer substrate, a back plate, a diaphragm, and an intermediate layer. The transducer substrate includes an aperture. The back plate is coupled to a first surface of the transducer substrate and covers the aperture. The diaphragm is oriented substantially parallel to the back plate and is spaced apart from the back plate to form a gap. The intermediate layer is coupled to the diaphragm and the back plate and includes an acoustic relief channel, which fluidly couples the gap to an environment surrounding the MEMS transducer.

A second aspect of the present disclosure relates to a method of making a MEMS transducer. The method includes providing a transducer substrate and depositing a back plate onto the transducer substrate. The method additionally includes depositing an intermediate layer onto the back plate and depositing a diaphragm onto the intermediate layer. The method further includes releasing the diaphragm from the back plate to form a gap. The method also includes forming a plurality of acoustic relief channels in the intermediate layer that fluidly couple the gap to an environment surrounding the MEMS transducer.

A third aspect of the present disclosure relates to a microphone assembly. The microphone assembly includes a housing having a base, a cover, and a port. The housing defines an enclosed volume within the microphone assembly. The microphone assembly additionally includes a MEMS transducer disposed in the enclosed volume. The MEMS transducer includes a transducer substrate, a back plate, a diaphragm, and an intermediate layer. The transducer substrate includes an aperture. The back plate is coupled to a first surface of the transducer substrate and covers the aperture. The diaphragm is coupled to the back plate and is in fluidic communication with the enclosed volume. The diaphragm is oriented substantially parallel to the back plate and is spaced apart from the back plate to form a gap. The intermediate layer is coupled to the diaphragm and the back plate and includes an acoustic relief channel, which fluidly couples the gap to the enclosed volume.

The foregoing summary is illustrative only and is not intended to be in any way limiting. In addition to the illustrative aspects, embodiments, and features described above, further aspects, embodiments, and features will become apparent by reference to the following drawings and the detailed description.

BRIEF DESCRIPTION OF THE DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope. Various embodiments are described in more detail below in connection with the appended drawings.

In the following detailed description, various embodiments are described with reference to the appended drawings. The skilled person will understand that the accompanying drawings are schematic and simplified for clarity and therefore merely show details which are essential to the understanding of the disclosure, while other details have been left out. Like reference numerals refer to like elements or components throughout. Like elements or components will therefore not necessarily be described in detail with respect to each figure.

DETAILED DESCRIPTION

In general, disclosed herein are devices and systems for providing high low frequency roll-off (LFRO) performance in a MEMS acoustic transducer. In particular, according to some embodiments, methods and devices are described for providing high-LFRO performance for diaphragm-on-top MEMS acoustic transducers that include a movable diaphragm and a back plate located between a transducer substrate of the MEMS acoustic transducer and the moveable diaphragm. In some embodiments, the methods and devices disclosed herein may have lower sensitivity to pressure changes in a low frequency range (e.g., changes in ambient pressure).

In various illustrative embodiments, the MEMS acoustic transducer includes a transducer substrate, a stationary back plate disposed on a first surface of the transducer substrate, and a moveable diaphragm. The diaphragm is spaced apart from the back plate by an intermediate layer to form a gap between the diaphragm and the back plate. The intermediate layer includes an acoustic relief channel (e.g., passageway, pathway, etc.) that fluidly couples the gap to an environment surrounding the MEMS acoustic transducer (e.g., a back volume of the microphone assembly) which, advantageously, allows for faster and/or more efficient equalization of air pressure across the diaphragm (e.g., between opposite sides of the diaphragm). In high sound pressure level applications, quicker equalization of pressures across the diaphragm increases the sound quality output from the microphone assembly.

In some embodiments, the intermediate layer includes a sacrificial layer (e.g., an oxide layer) that couples the diaphragm to the back plate. The acoustic relief channel can be formed into the sacrificial layer by over-etching the sacrificial layer during manufacturing of the MEMS acoustic transducer. The acoustic relief channel can extend radially outward through a side of the acoustic transducer, which, advantageously, can prevent dirt and other contaminants from entering the gap between the diaphragm and the back plate (and particularly when compared to MEMS transducers that include pierced diaphragms). In some embodiments, the MEMS transducer additionally includes a plurality of posts disposed proximate to the acoustic relief channel in order to support the diaphragm in the vicinity of the acoustic relief channel. The details of the general depiction provided above will be more fully explained by reference to FIGS. 1-13.

Figure 1:
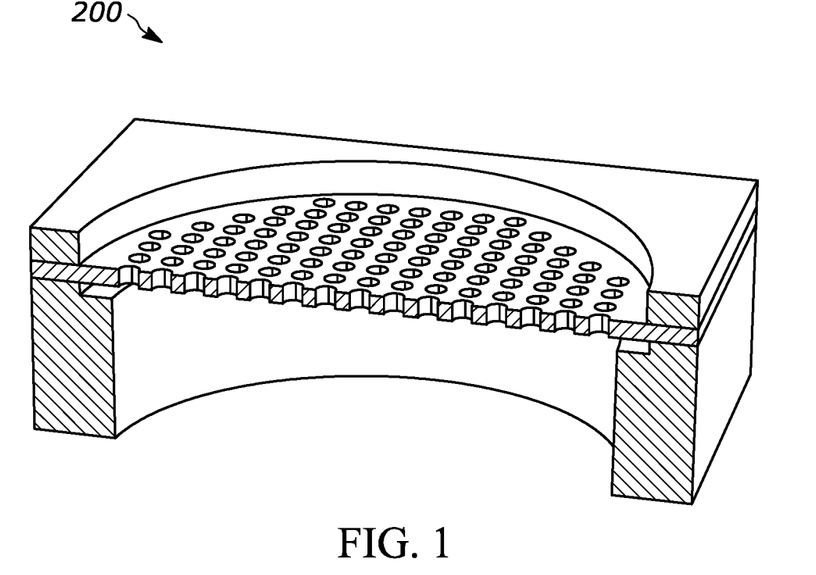
FIG. 1 is a perspective cross-sectional view of a MEMS acoustic transducer that does not include acoustic relief channels, according to an illustrative embodiment.
Figure 2:
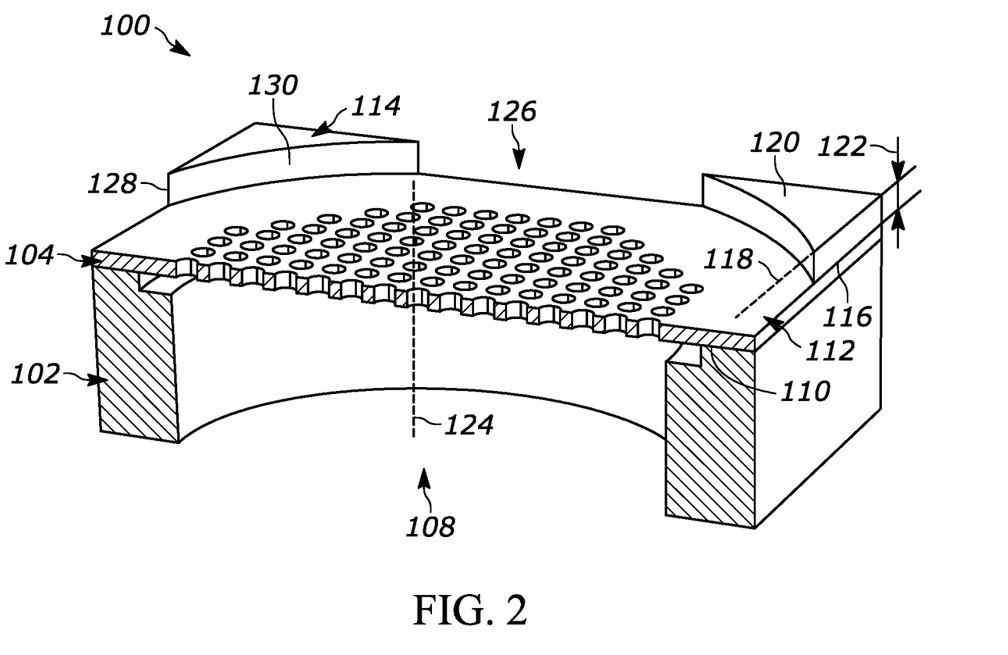
FIG. 2 is a perspective cross-sectional view of a MEMS acoustic transducer including acoustic relief channels, according to an illustrative embodiment.

FIG. 1 shows a perspective view of a MEMS transducer that does not include acoustic relief channels, shown as blocked transducer 200. FIG. 2 shows a top view of a MEMS transducer 100 including a plurality of acoustic relief channels 126 ("unblocked transducer 100"), according to an illustrative embodiment. The MEMS transducer 100 is configured as a capacitive acoustic transducer structured to generate an electrical signal in response to acoustic disturbances incident on the MEMS transducer 100. The MEMS transducer 100 includes a transducer substrate 102, a stationary back plate 104, and a movable diaphragm (not shown). The transducer substrate 102 includes an aperture 108 disposed through the transducer substrate 102. The aperture 108 is shaped as a cylinder, although any other suitable shape may be used in alternative embodiments. The aperture 108 is structured to carry (e.g., transmit, etc.) sound energy (e.g., pressure) to at least one of the diaphragm or the back plate 104.

As shown in FIG. 2, the back plate 104 is coupled to a first surface 110 of the transducer substrate 102. In some embodiments, the back plate 104 is deposited directly onto the first surface 110. The back plate 104 is perforated to allow sound (e.g., air pressure) received by the aperture 108 to pass through the back plate 104. In some embodiments, the diaphragm (not shown in FIG. 2, but shown as diaphragm 106 in FIG. 5) includes an opening or pierce to allow a small amount of air to pass through the diaphragm and into a back volume of a microphone assembly. Sound energy (e.g., sound waves, acoustic disturbances, etc.) incident on the diaphragm causes the diaphragm to move toward or away from the back plate 104. The change in distance results in a corresponding change in capacitance between conductive materials disposed on or within the diaphragm and the back plate 104. An electrical signal representative of the change in capacitance may be generated and transmitted to other portions of the microphone assembly, such as an integrated circuit, for processing.

The diaphragm is oriented parallel (or substantially parallel) to the back plate 104 and is spaced apart from the back plate 104 to form a gap 112. The diaphragm is indirectly coupled to the back plate 104 by the intermediate layer 114 (e.g., an intervening layer) and is spaced apart from the back plate 104 by an intermediate layer 114. A first side 116 of the intermediate layer 114 is coupled to the back plate 104. A second side 120 of the intermediate layer 114 is coupled to the diaphragm along at least a portion of a perimeter 118 of the diaphragm. A height 122 of the intermediate layer 114 (e.g., an axial height of the intermediate layer 114 parallel to a central axis 124 of the aperture 108) is approximately equal to a distance between the diaphragm and the back plate 104 (e.g., a height of the gap 112). In various illustrative embodiments, the intermediate layer 114 includes a sacrificial layer (e.g., an oxide layer, a phosphosilicate glass (PSG) layer, a nitride layer, or any other suitable material) that is deposited or otherwise formed onto the back plate 104. In other embodiments, the intermediate layer 114 is integrally formed with the transducer substrate 102 as a single unitary structure (e.g., such that the intermediate layer 114 forms a portion of the transducer substrate 102).

As shown in FIG. 2, the intermediate layer 114 includes a plurality of acoustic relief channels 126. In other embodiments, the intermediate layer 114 may include additional and/or fewer acoustic relief channels 126. Each one of the acoustic relief channels 126 fluidly couples the gap 112 to an environment surrounding the MEMS transducer 100 (e.g., a back volume of a microphone assembly), thereby allowing air to pass freely between the gap 112 and the environment. Among other benefits, the acoustic relief channels 126 provide barometric relief between air on opposing sides of the diaphragm, which reduces the sensitivity of the MEMS transducer 100 at low frequencies to a greater extent than can be achieved by using a pierced diaphragm alone.

Figure 3:
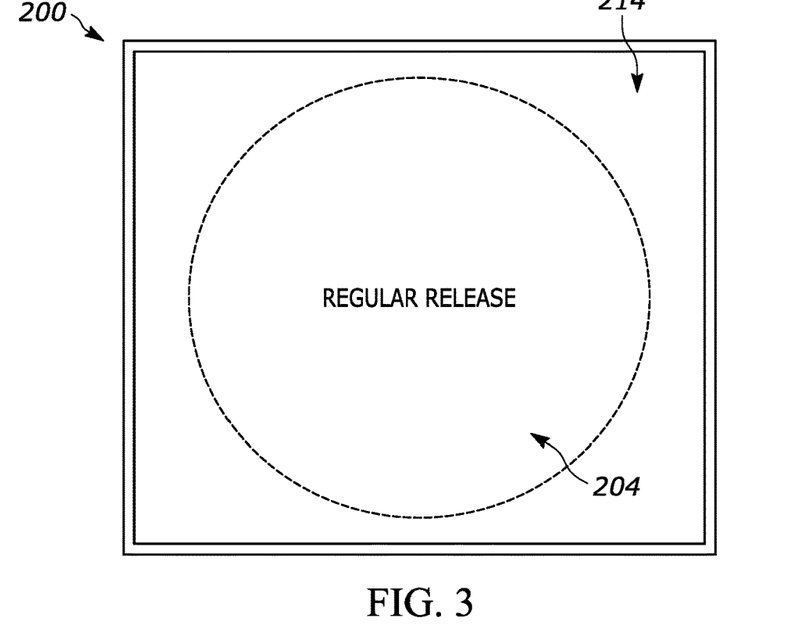
FIG. 3 is a top cross-sectional view of the MEMS acoustic transducer of FIG. 1, according to an illustrative embodiment.
Figure 4:
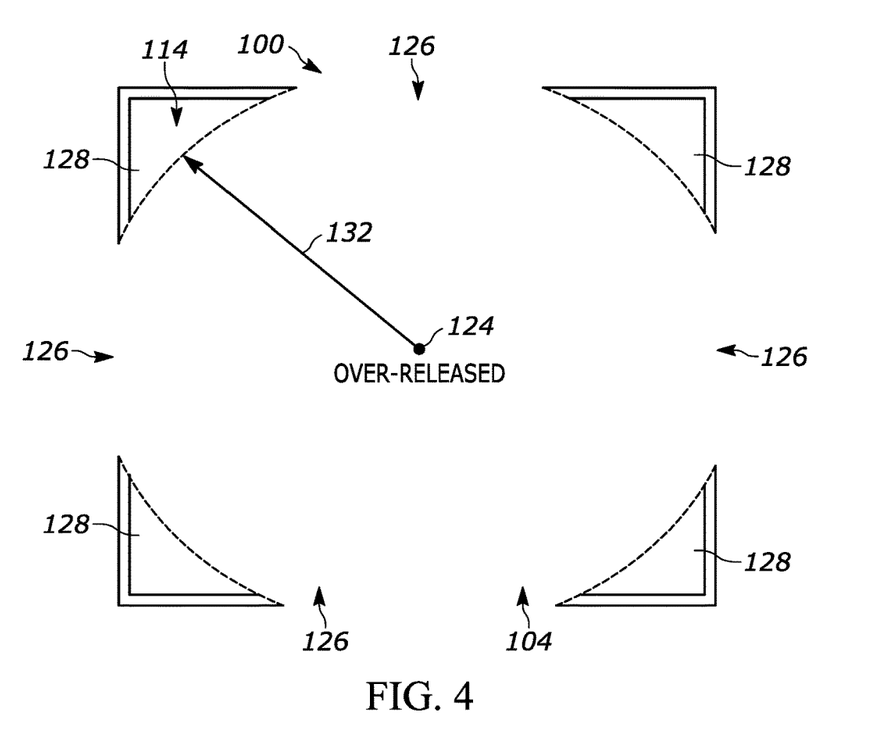
FIG. 4 is a top cross-sectional view of the MEMS acoustic transducer of FIG. 2.

In the illustrative embodiment of FIG. 1, the acoustic relief channels 126 are etched into the intermediate layer 114 using a wet or dry etching process (e.g., reactive ion etching (RIE), deep RIE (DRIE), focused ion beam etching (FIB), etc.) or any other suitable etching process. FIG. 3 shows a top view of the blocked transducer 200, which does not include acoustic relief channels. FIG. 4 shows a top view of the MEMS transducer 100 of FIG. 2 ("unblocked transducer 100"). Both the blocked transducer 200 and the unblocked transducer 100 are shown at a cross-section through an intermediate layer (214, 114) between the back plate and the diaphragm. As shown in FIG. 3, in a typical manufacturing operation for the blocked transducer 200, a central portion of the intermediate layer 214 is removed in order to separate or otherwise "release" the diaphragm from the back plate. For example, the intermediate layer 214 may be removed using a timed dry etch process (e.g., an RIE or DRIE process) in which a chemical solution is applied to the intermediate layer 214 for a predefined period of time until a portion of the intermediate layer 214 that covers the perforations in the back plate is removed.

In the embodiment of FIG. 4, the acoustic relief channels 126 are formed into the intermediate layer 214 by over-etching the intermediate layer 114 during the release operation. In other words, the acoustic relief channels 126 are formed by increasing the period of time during which the central portion of the intermediate layer 114 is exposed to the chemical etching solution. The etching solution removes the intermediate layer 114 along a radial direction relative to the central axis 124 of the MEMS transducer 100 (e.g., the central axis 124 of the aperture 108 shown in FIG. 1). As shown in FIG. 4, the etching operation forms a total of four acoustic relief channels 126 that are spaced equally about the perimeter 118 of the diaphragm 106 (e.g., at approximately 90° increments). The etching operation separates the intermediate layer 114 into a plurality of intermediate layer pieces 128, each disposed proximate to an outer corner region of the MEMS transducer 100. As shown in FIG. 4, each one of the intermediate layer pieces 128 is triangular and includes an arcuate inner surface 130 (e.g., a curved inner surface). A radius 132 of each one of the arcuate inner surfaces 130, relative to the central axis 124 of the aperture 108, is approximately equal. The radius 132 of each one of the arcuate inner surfaces 130 varies depending on the period of time that the chemical etching solution is exposed to the intermediate layer 114. Increasing the radius of each one of the arcuate inner surfaces 130 increases the LFRO of the transducer. In some embodiments, the acoustic relief channels 126 can increase the LFRO by as much as a few kHz relative to the blocked transducer 200 with a pierced diaphragm (e.g., an unblocked transducer 100 having acoustic relief channels 126 that cover approximately 40% of a perimeter of the diaphragm can increase the LFRO of a pierced diaphragm MEMS by as much as two orders of magnitude in some embodiments, from approximately 100 Hz to approximately 10 kHz). As shown in FIG. 2, each one of the intermediate pieces 128 are 3-sided prisms.

In other embodiments, the acoustic relief channels 126 may be selectively etched into the intermediate layer 114 using a secondary operation that is separate from the release operation. For example, the acoustic relief channels 126 may be etched into the intermediate layer 114 using a wet etch process (e.g., using buffered hydrofluoric acid (BHF)) from an outer surface of the intermediate layer 114. In yet other embodiments, the acoustic relief channels 126 may be machined into the intermediate layer 114 via a drilling operation. For example, the acoustic relief channels 126 may be formed by laser cutting horizontal passages from an outer surface of the intermediate layer 114 after the diaphragm has been released from the back plate 104 (e.g., after etching the intermediate layer 114 to form the gap 112 between the diaphragm and the back plate 104).

Figure 5:
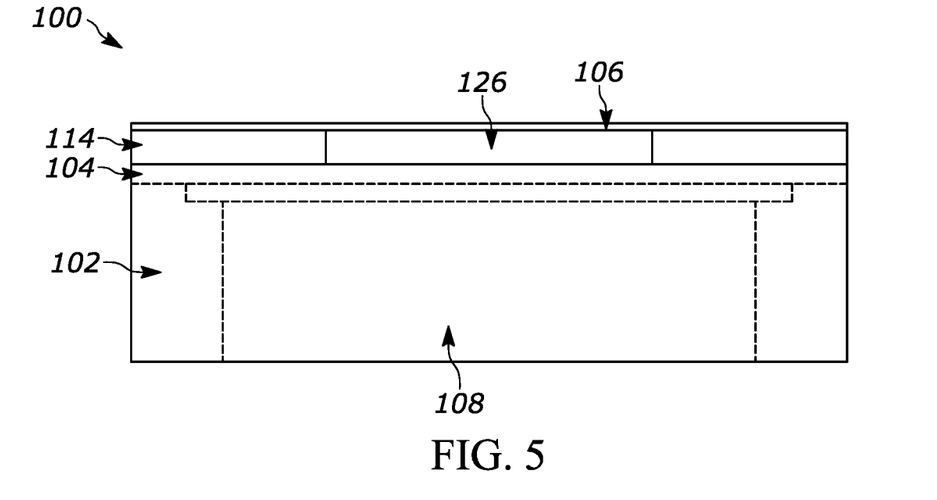
FIG. 5 is a side view of the MEMS acoustic transducer of FIG. 2.
Figure 6:
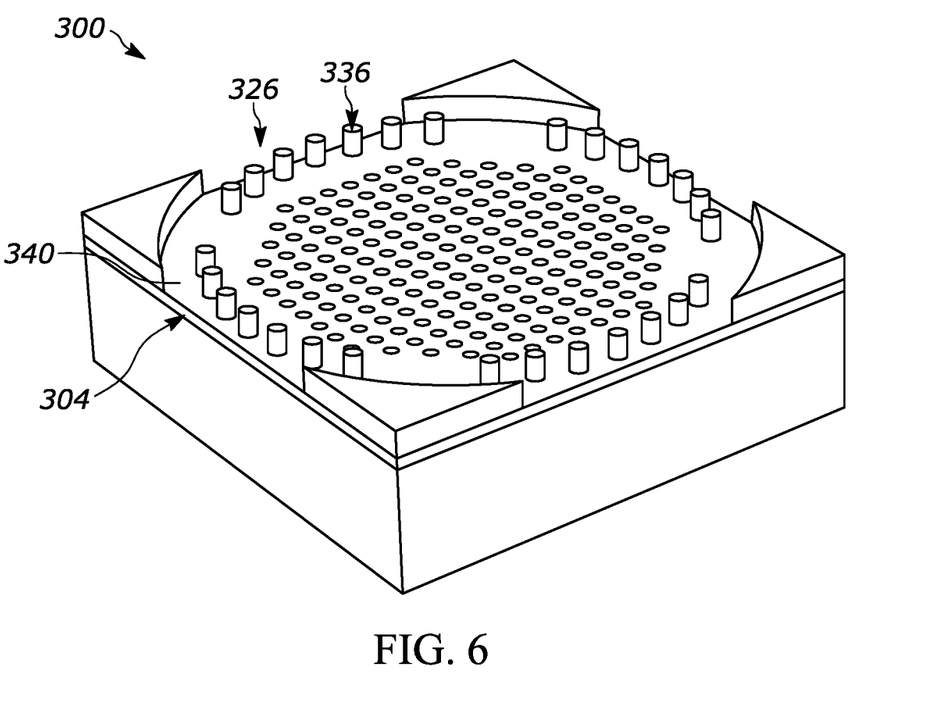
FIG. 6 is a perspective view of a MEMS acoustic transducer that includes cylindrical posts between the back plate and the diaphragm, according to an illustrative embodiment.

FIG. 5 shows a side cross-sectional view of the MEMS transducer 100 including the diaphragm 106. Each one of the acoustic relief channels 126 includes a through-hole that extends radially outward (e.g., horizontally, into and out of the page as shown in FIG. 6) through an exterior surface of the MEMS transducer 100. The through-hole is shaped as a rectangular window. In other embodiments, the shape and/or size of the acoustic relief channels 126 may be different.

Figure 7:
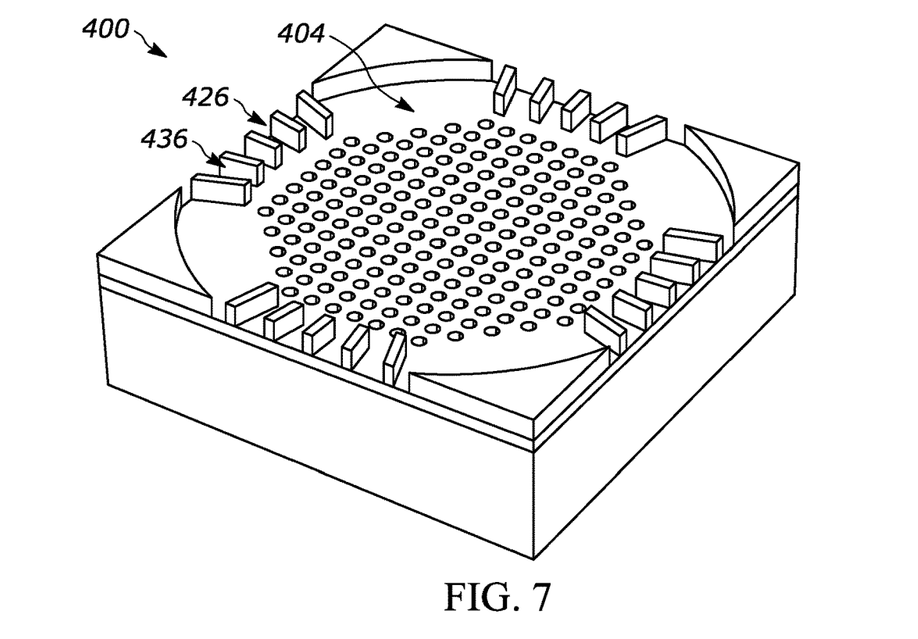
FIG. 7 is a perspective cross-sectional view of a MEMS acoustic transducer that includes rectangular walls between the back plate and the diaphragm, according to an illustrative embodiment.
Figure 8:
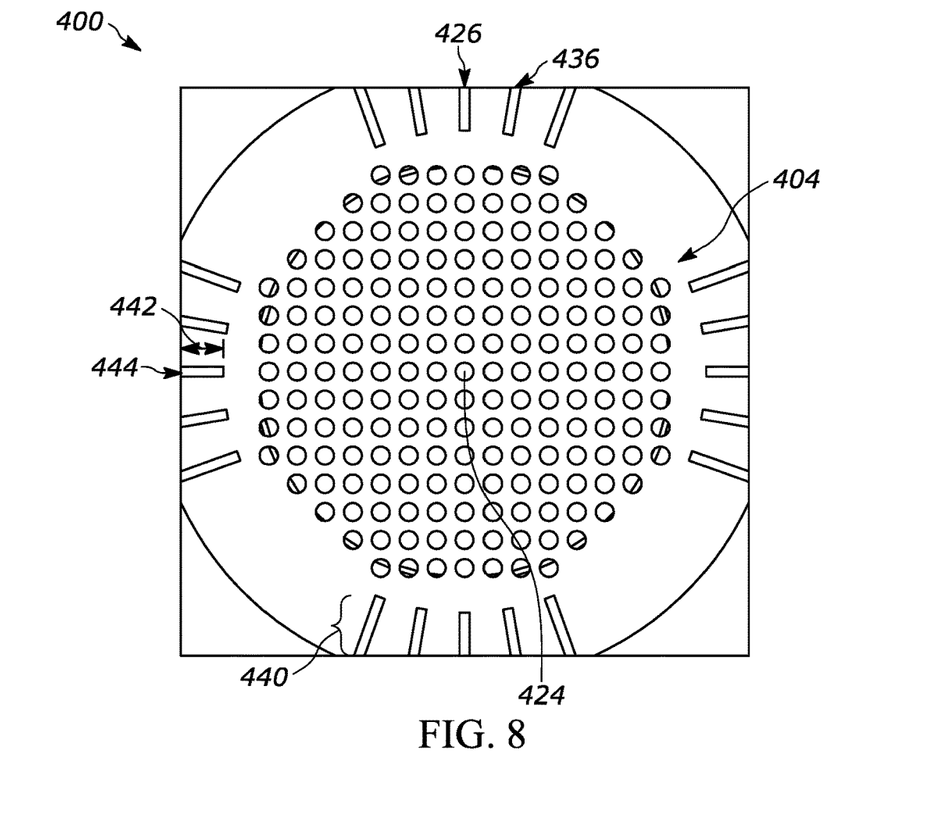
FIG. 8 is a top cross-sectional view of the MEMS acoustic transducer of FIG. 7.

FIG. 6 depicts a MEMS transducer 300 that includes a plurality of posts 336 disposed within each one of a plurality of acoustic relief channels 326. The posts 336 are structured to support a diaphragm within each of the acoustic relief channels 326 in order to increase the robustness of the MEMS transducer 300. The posts 336 extend between a back plate 304 of the MEMS transducer 300 and a diaphragm (not shown). In some embodiments, the posts 336 are integrally formed with the diaphragm as a single unitary structure. As shown in FIG. 6, each one of the posts 336 is a cylinder extending from an upper surface 340 of the back plate 304 in substantially perpendicular orientation relative to the upper surface 340. In other embodiments, the size, arrangement, and position of the posts 336 may be different. For example, FIGS. 7 and 8 depict a MEMS transducer 400 having posts 436 that are rectangular walls. Each one of the rectangular walls extends radially outward through at least a portion 440 (e.g., an outer portion proximate to an outer perimeter of a back plate 404 and the diaphragm) of a corresponding one of a plurality of acoustic relief channels 426. As shown in FIG. 8, a length 442 of each of the posts 436, in a substantially radial direction (e.g., away from a central axis 424 of the MEMS transducer 400), increases gradually with increasing distance from a central position 444 within each acoustic relief channel 426. A thickness of each one of the rectangular walls 438 normal to a flow direction through each acoustic relief channel 426 is much less than a width of each acoustic relief channel 426 in order to minimize pressure drop through each acoustic relief channel 426.

Figure 9:
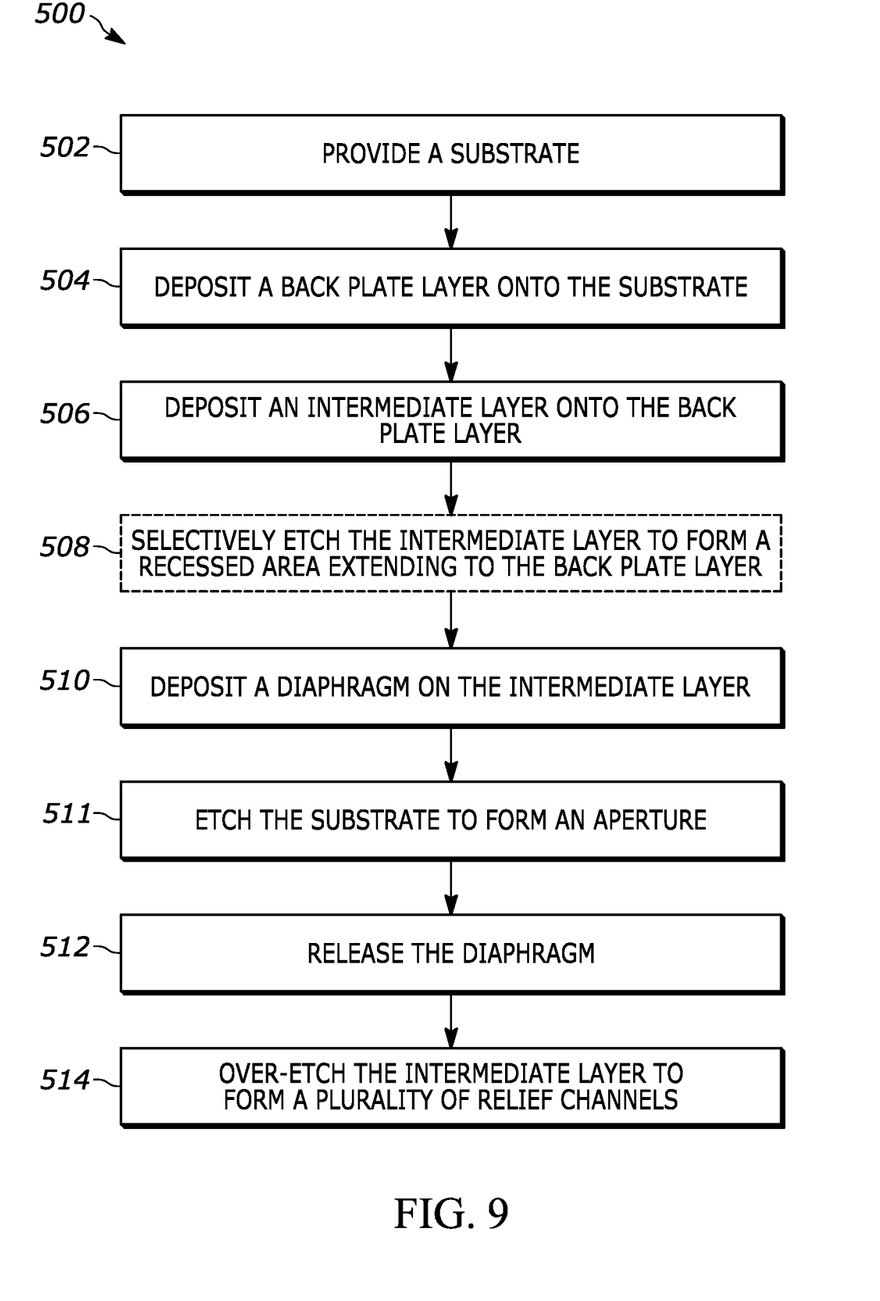
FIG. 9 is a flow diagram of a method of making a MEMS acoustic transducer, according to an illustrative embodiment.
Figure 10A:
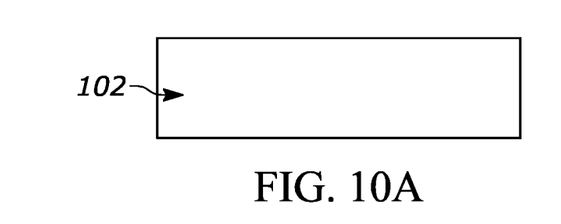
FIGS. 10A-10F are side cross-sectional views of a MEMS acoustic transducer in various stages of assembly, according to various illustrative embodiments.

FIG. 9 is a flow diagram of a method 500 of making a MEMS transducer. The MEMS transducer may be the same or similar to the MEMS transducer 100 of FIG. 2 (or, alternatively, the MEMS transducer 300, 400 of FIGS. 6 and 7-8, respectively). Various steps of the method 500 are illustrated conceptually in FIGS. 10A-10F. For simplicity, similar numbering is used to identify similar components. At 502, a transducer substrate 102 is provided (see FIG. 10A). The transducer substrate 102 may be formed from silicon, silicon oxide, glass, Pyrex, quartz, ceramics, or any other suitable material. At 504, a back plate 104 is deposited onto a first surface 110 of the transducer substrate 102. The back plate 104 may be formed from a low stress material, for example low stress silicon nitride (LSN), low stress oxide, or any other suitable material. Operation 504 may include depositing the back plate 104 onto the transducer substrate 102 using physical vapor deposition (PVD), chemical vapor deposition (CVD), low pressure chemical vapor deposition (LPCVD), plasma enhanced CVD (PECVD), atomic layer deposition (ALD), any other suitable process or a combination thereof. The back plate 104 may be relatively inflexible relative to a diaphragm 106 to be formed on the transducer substrate 102.

Figure 10B:
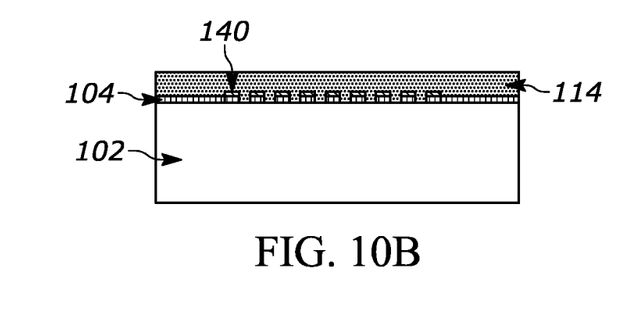
Figure 10C:
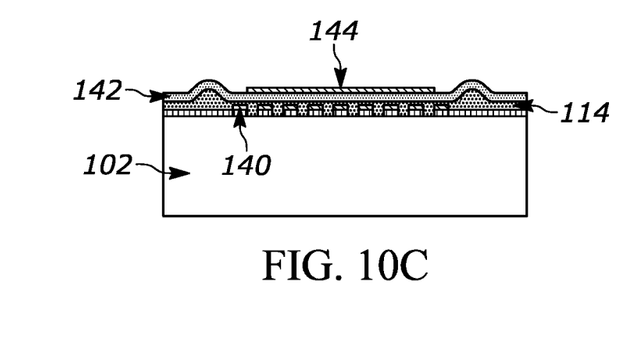

In some embodiments, the method 500 may further include depositing a conducting layer 140 such as polysilicon, gold, platinum, or the any other suitable material onto the back plate 104. The method 500 may additionally include forming apertures through the back plate 104 and the conducting layer 140, for example, by using a wet or dry etching process. The conducting layer may also be etched to form an electrical contact on the back plate 104. At 506, an intermediate layer 114 is deposited onto one of the back plate 104 and/or the conducting layer 140 such that the intermediate layer 114 covers an upper surface of the back plate 104. FIG. 10B shows the transducer substrate 102, the perforated back plate 104 and conductive layer 140, and the intermediate layer 114 after step 506. As shown in FIG. 10C, the method 500 may additionally include depositing an additional (second) intermediate layer 142 onto the first intermediate layer 114 and/or an additional (second) conductive layer 144 onto one of the first or second intermediate layers 114. The method 500 may further include heating the MEMS transducer 100 to a temperature that is higher than a glass transition temperature for at least one of the intermediate layers 114, thus causing the at least one intermediate layer 114 to flow and round-off the corners thereof.

Figure 11A:
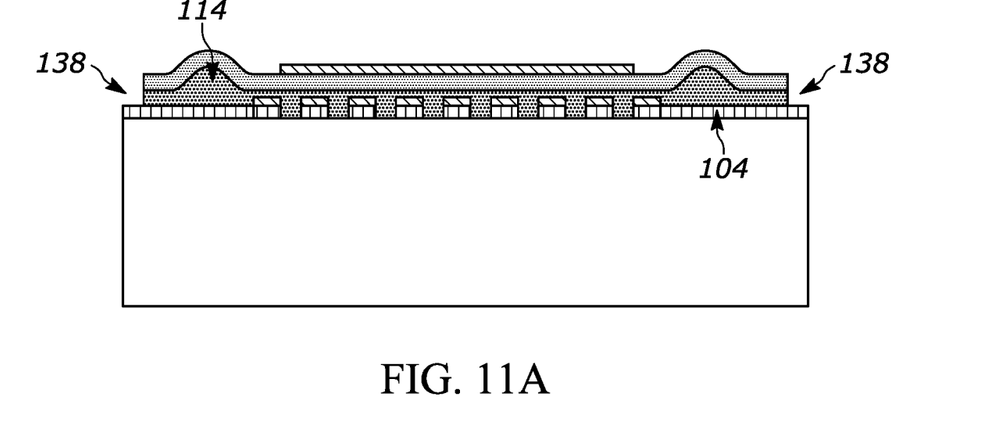
FIGS. 11A-11B are side cross-sectional views of a MEMS acoustic transducer including posts between a back plate and a diaphragm, in various stages of assembly, according to various illustrative embodiments.

In some embodiments, the method 500 includes selectively etching the intermediate layer 114 to form a recessed area 138 or a plurality of recessed areas 138 extending to an upper surface of the back plate 104 (operation 508). Operation 508 is depicted conceptually in FIGS. 11A and 11B. A recessed area 138 is formed proximate to a perimeter of the MEMS transducer 100 on either side of the MEMS transducer 100. The recessed areas 138 may be sized to accommodate the posts 336, 436 that structurally support the diaphragm 106 proximate to the acoustic relief channels 126. For example, the recessed areas 138 may be circular, rectangular, or any other suitable shape. Operation 508 may additionally include masking the MEMS transducer 100 to position each of the recessed areas 138 adjacent to an area where the acoustic relief channels 126 will be located.

Figure 10D:
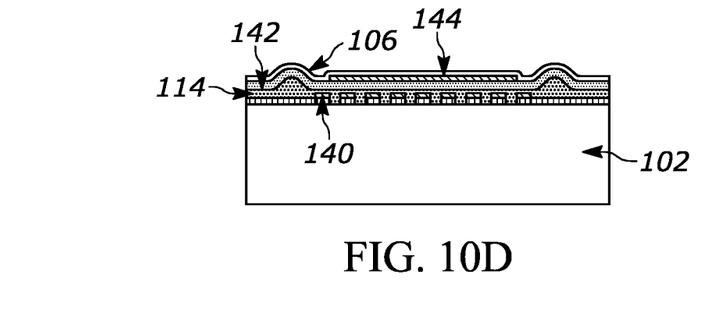
Figure 11B:
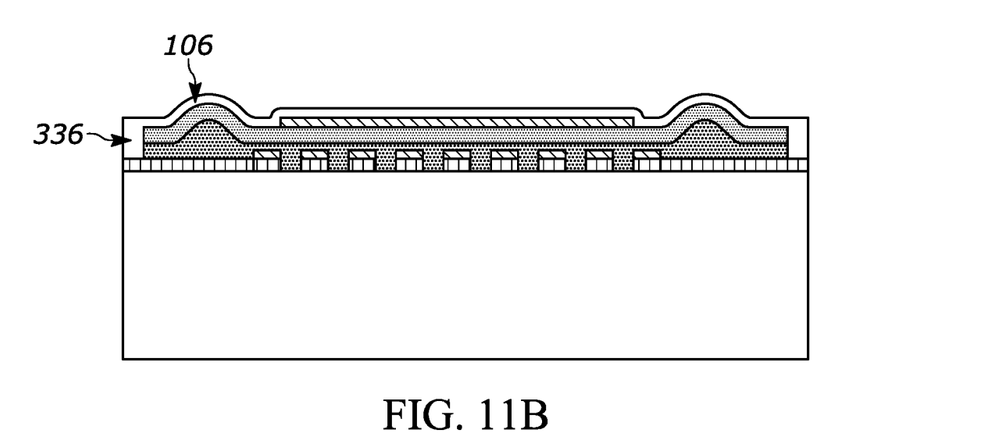

At 510, a diaphragm material is deposited onto the intermediate layer 114 (onto the second intermediate layer 142 and the second conductive layer 144 as shown in FIG. 10D). A first portion of the diaphragm material forms the diaphragm 106, which may be approximately the same as a shape of an upper surface of the intermediate layer 114. As shown in FIG. 11B, a second portion of the diaphragm material is deposited into the recessed areas 138. This second portion of the diaphragm material forms posts that help support the diaphragm 106 in the area where the acoustic relief channels 126 will be located (e.g., such as the posts 336 and 436 of FIGS. 6 and 7-8, respectively). In some embodiments, the method 500 additionally includes selectively etching the second portion to form the posts 336, 436 in the area where the acoustic relief channels 126 will be located.

Figure 10E:
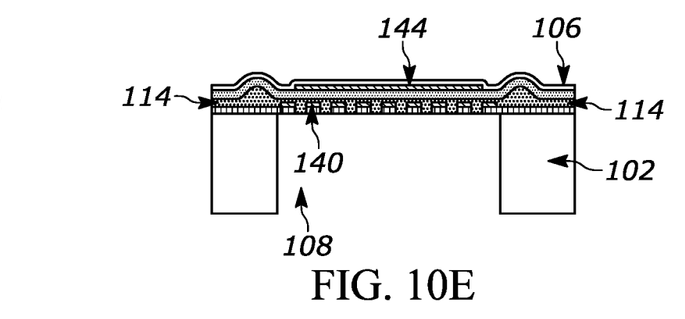

At 511, the transducer substrate 102 is etched to form an aperture 108 into the transducer substrate 102 (see FIG. 10E). The etching operation may be performed from a second surface of the transducer substrate 102, opposite to the first surface 110 and may remove material along a central axis of the transducer substrate 102. At 512, the diaphragm 106 is released from the back plate 104. Operation 512 may include performing a back-side etch through the aperture 108 of the transducer substrate 102. Operation 512 may additionally include removing a central portion of the intermediate layer 114 between the diaphragm 106 and the back plate 104 to form the gap 112 between the diaphragm 106 and the back plate 104. Operation 512 may include performing the etching operation for a first predefined time period until the intermediate layer 114 is removed from above the apertures (e.g., a perforated portion) in the back plate 104.

Figure 10F:
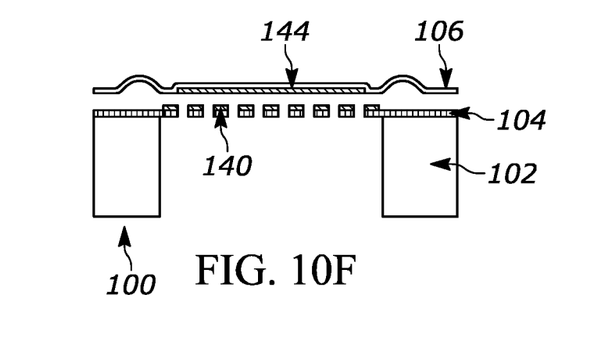

At 514, the intermediate layer 114 is over-etched to form a plurality of acoustic relief channels 126 (see FIG. 10F, which also shows the MEMS transducer 100 after operation 512). In the area of the acoustic relief channels 126, the intermediate layer 114 has been removed completely by operation 514. It should be understood, however, that pieces of the intermediate layer 114 remain to support the diaphragm 106 in position with respect to the back plate 104 (e.g., near the corners of the MEMS transducer 100 as shown in FIG. 4). The remaining pieces of the intermediate layer 114 are not shown in the cross-sectional view of FIG. 10F. Operation 514 may include continuing the back-side etch operation of block 512 for a second predefined time period beyond the first predefined time period. The second predefined time period may be a time that is required (from the end of the first predefined time period) in order to form a through-hole channel between the gap 112 and an environment surrounding the MEMS transducer 100 (in at least one location along a perimeter of the MEMS transducer 100). In some embodiments, the second predefined time period may be a time required to form at least one acoustic relief channel 126 of a desired size (width, etc.). A size of the acoustic relief channel 126, and the amount of LFRO associated with the MEMS transducer 100, increases with increasing etch times. In alternative embodiments, method 500 may include additional, fewer, and/or different operations.

Figure 12:
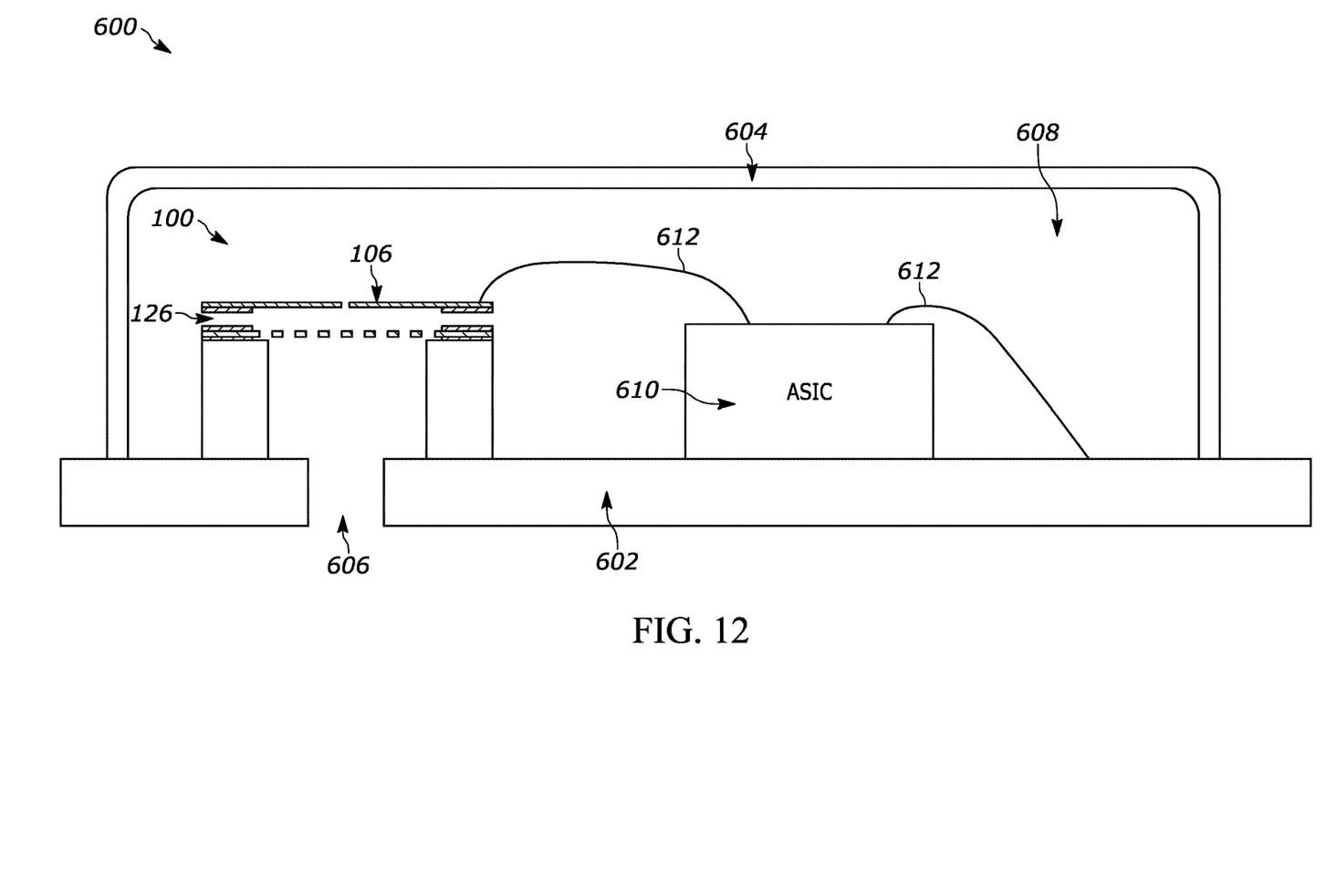
FIG. 12 is a side cross-sectional view of a microphone assembly, according to an illustrative embodiment.

According to an illustrative embodiment, as shown in FIG. 12, the MEMS transducer (e.g., the MEMS transducer 100 of FIG. 2), is configured to be received within a microphone assembly, shown as assembly 600. As shown in FIG. 12, the assembly 600 includes a housing including a microphone base 602, a cover 604 (e.g., a housing lid), and a sound port 606. In some embodiments, the microphone base 602 is a printed circuit board. The cover 604 is coupled to the microphone base 602 (e.g., the cover 604 may be mounted onto a peripheral edge of the microphone base 602). Together, the cover 604 and the microphone base 602 may form an enclosed volume 608 for the assembly 600. As shown in FIG. 12, the sound port 606 is disposed on the microphone base 602 and is structured to convey sound waves to a MEMS transducer 100 located within the enclosed volume 608. Alternatively, the sound port 606 may be disposed on the cover 604 or on a side wall of the housing. As shown in FIG. 12, the MEMS transducer 100 includes a plurality of acoustic relief channels 126 that fluidly couple both sides of the diaphragm 106 to the enclosed volume 608. In some embodiments, the assembly may form part of a compact computing device (e.g., a portable communication device, a smartphone, a smart speaker, an internet of things (IoT) device, etc.), where one, two, three or more assemblies may be integrated for picking-up and processing various types of acoustic signals such as speech and music.

As shown in FIG. 12, the assembly 600 additionally includes an electrical circuit disposed in the enclosed volume 608. The electrical circuit includes an integrated circuit (IC) 610. The IC 610 may be an application specific integrated circuit (ASIC). Alternatively, the IC 610 may include another type of semiconductor die integrating various analog, analog-to-digital, and/or digital circuits.

In the embodiment of FIG. 12, the MEMS transducer 100 is configured to generate an electrical signal (e.g., a voltage) at a transducer output in response to acoustic activity incident on the port 606. As shown in FIG. 12, the transducer output includes a pad or terminal of MEMS transducer 100 that is electrically connected to the electrical circuit via one or more bonding wires 612. The assembly 600 can further includes electrical contacts disposed on a surface of the microphone substrate 602 outside of the cover 604. The contacts may be electrically coupled to the electrical circuit (e.g. via bonding wires 612) and may be configured to electrically connect the microphone assembly 600 to one of a variety of host devices.

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A MEMS transducer, comprising:
a transducer substrate comprising an aperture;
a back plate coupled to a first surface of the transducer substrate and covering the aperture;
a diaphragm oriented substantially parallel to the back plate and spaced apart from the back plate to form a gap;
an intermediate layer coupled to the diaphragm and the back plate, the intermediate layer comprising an acoustic relief channel, the acoustic relief channel fluidly coupling the gap to an environment surrounding the MEMS transducer; and
a plurality of posts disposed within the acoustic relief channel, wherein the posts are coupled to the diaphragm and the back plate.

2. The MEMS transducer of claim 1, wherein the intermediate layer is coupled to the back plate and the diaphragm along a perimeter of the diaphragm.

3. The MEMS transducer of claim 1, wherein the intermediate layer comprises a sacrificial layer.

4. The MEMS transducer of claim 1, wherein the intermediate layer comprises a plurality of intermediate layer pieces, wherein each one of the intermediate layer pieces comprises an arcuate surface, and wherein a radius of the arcuate surface of each one of the intermediate layer pieces is approximately equal.

5. The MEMS transducer of claim 1, wherein the acoustic relief channel extends radially outward through a side of the MEMS transducer.

6. The MEMS transducer of claim 1, wherein the acoustic relief channel is one of a plurality of acoustic relief channels spaced equally about a perimeter of the diaphragm.

7. The MEMS transducer of claim 1, wherein each one of the posts comprises a cylinder extending between the diaphragm and the back plate.

8. The MEMS transducer of claim 1, wherein each one of the posts comprises a rectangular wall extending between the diaphragm and the back plate, and wherein the rectangular wall extends radially outward through at least a portion of the acoustic relief channel.

9. A method of making a MEMS transducer, comprising:
providing a transducer substrate;
depositing a back plate onto the transducer substrate;
depositing an intermediate layer onto the back plate;
depositing a diaphragm onto the intermediate layer;
releasing the diaphragm from the back plate to form a gap between the diaphragm and the back plate;
forming a plurality of acoustic relief channels in the intermediate layer, wherein the acoustic relief channels fluidly couple the gap to an environment surrounding the MEMS transducer; and forming a plurality of posts onto the diaphragm extending from the diaphragm to the back plate.

10. The method of claim 9, wherein forming the plurality of acoustic relief channels comprises etching the acoustic relief channels into the intermediate layer to form a plurality of channels spaced equally about a perimeter of the diaphragm.

11. The method of claim 9, wherein forming the plurality of acoustic relief channels comprises machining the acoustic relief channels into the intermediate layer using a laser cutting operation.

12. The method of claim 9, wherein the posts comprise a silicon nitride material.

13. A microphone assembly, comprising:
a housing comprising a base, a cover, and a port, wherein the housing defines an enclosed volume;
a MEMS transducer disposed in the enclosed volume, wherein the MEMS transducer comprises:
a transducer substrate defining an aperture;
a back plate coupled to a first surface of the transducer substrate and covering the aperture; and
a diaphragm coupled to the back plate, the diaphragm in fluid communication with the enclosed volume, the diaphragm oriented substantially parallel to the back plate and spaced apart from the back plate to form a gap; and
an intermediate layer coupled to the diaphragm and the back plate, the intermediate layer comprising an acoustic relief channel, the acoustic relief channel fluidly coupling the gap to the enclosed volume,
wherein the MEMS transducer further comprises a plurality of posts disposed proximate to the acoustic relief channel, wherein the posts are coupled to the diaphragm and the back plate.

14. The microphone assembly of claim 13, wherein the intermediate layer is coupled to the back plate and the diaphragm along a perimeter of the diaphragm.

15. The microphone assembly of claim 14, wherein the intermediate layer comprises a sacrificial layer.

16. The microphone assembly of claim 13, wherein the acoustic relief channel extends radially outward through a side of the MEMS transducer.

17. The microphone assembly of claim 13, wherein the acoustic relief channel is one of a plurality of acoustic relief channels spaced equally about a perimeter of the diaphragm.

18. The microphone assembly of claim 13, wherein each one of the posts comprises a cylinder extending between the diaphragm and the back plate.

19. The microphone assembly of claim 13, wherein each one of the posts comprises a rectangular wall extending between the diaphragm and the back plate, and wherein the rectangular wall extends radially outward through at least a portion of the acoustic relief channel.

20. The method of claim 9, wherein forming the plurality of posts comprises forming the plurality of posts within the acoustic relief channel.

21. The microphone assembly of claim 13, wherein the posts are disposed within the acoustic relief channel.

* * * * *